United States Patent
Ota et al.

(10) Patent No.: US 9,324,787 B2
(45) Date of Patent: Apr. 26, 2016

(54) SEMICONDUCTOR DEVICE

(71) Applicant: Kabushiki Kaisha Toshiba, Minato-ku (JP)

(72) Inventors: Chiharu Ota, Kawasaki (JP); Tatsuo Shimizu, Shinagawa (JP); Johji Nishio, Machida (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/467,146

(22) Filed: Aug. 25, 2014

(65) Prior Publication Data
US 2015/0060884 A1 Mar. 5, 2015

(30) Foreign Application Priority Data

Sep. 3, 2013 (JP) ................. 2013-182595

(51) Int. Cl.
*H01L 29/06* (2006.01)
*H01L 29/78* (2006.01)
(Continued)

(52) U.S. Cl.
CPC ........ *H01L 29/0634* (2013.01); *H01L 29/0619* (2013.01); *H01L 29/167* (2013.01);
(Continued)

(58) Field of Classification Search
CPC ............ H01L 29/0634; H01L 29/7816; H01L 29/1608; H01L 29/167; H01L 29/36; H01L 29/47; H01L 21/02529; H01L 21/0455
USPC .................................. 257/77, 493
See application file for complete search history.

(56) References Cited

U.S. PATENT DOCUMENTS

2004/0135153 A1  7/2004  Ryu et al.
2006/0054895 A1  3/2006  Ryu et al.
(Continued)

FOREIGN PATENT DOCUMENTS

JP  2006-516815 A  7/2006
JP  2007-305630 A  11/2007
(Continued)

OTHER PUBLICATIONS

Extended European Search Report issued Jan. 28, 2015 in Patent Application No. 14181173.7.
(Continued)

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

According to one embodiment, a semiconductor device includes a first semiconductor region, a second semiconductor region, a third semiconductor region, and a first electrode. The first semiconductor region is of a first conductivity type. The second semiconductor region is provided on the first semiconductor region, and is of a second conductivity type. The third semiconductor region is provided on the second semiconductor region, and is of the second conductivity type. The third semiconductor region contains a first impurity of the first conductivity type and a second impurity of the second conductivity type, and satisfies $1<D2/D1<3$, where D1 is a first concentration of the first impurity, and D2 is a second concentration of the second impurity. The first electrode is provided on the first, second, and third semiconductor regions. The first electrode is in contact with the second and third semiconductor regions.

19 Claims, 8 Drawing Sheets

(51) Int. Cl.
  *H01L 29/36* (2006.01)
  *H01L 29/861* (2006.01)
  *H01L 29/872* (2006.01)
  *H01L 29/16* (2006.01)
  *H01L 29/167* (2006.01)
  *H01L 29/66* (2006.01)
  *H01L 29/04* (2006.01)

(52) U.S. Cl.
  CPC ............ *H01L29/1608* (2013.01); *H01L 29/36* (2013.01); *H01L 29/7816* (2013.01); *H01L 29/8613* (2013.01); *H01L 29/872* (2013.01); *H01L 29/045* (2013.01); *H01L 29/6606* (2013.01)

(56) References Cited

U.S. PATENT DOCUMENTS

| | | |
|---|---|---|
| 2006/0118792 A1 | 6/2006 | Ryu et al. |
| 2009/0035926 A1 | 2/2009 | Ryu et al. |
| 2010/0308344 A1* | 12/2010 | Seki et al. ................ 257/77 |
| 2011/0081772 A1 | 4/2011 | Ryu et al. |
| 2011/0220913 A1 | 9/2011 | Hatakeyama |
| 2012/0025153 A1 | 2/2012 | Hirose et al. |
| 2012/0228636 A1* | 9/2012 | Maeyama et al. ........... 257/77 |
| 2014/0048847 A1 | 2/2014 | Yamashita et al. |

FOREIGN PATENT DOCUMENTS

| | | |
|---|---|---|
| JP | 2008-218700 | 9/2008 |
| JP | 2008-251772 A | 10/2008 |
| JP | 2010-53035 A | 3/2010 |
| JP | 2012-31014 A | 2/2012 |
| WO | WO 2013/014943 A2 | 1/2013 |
| WO | WO 2013/014943 A3 | 1/2013 |

OTHER PUBLICATIONS

Masanori Miyata, et al., "Theoretical Study of Acceptor-Donor Complexes in 4H-SiC" Applied Physics Express, vol. 1, XP055122805, Oct. 24, 2008, 3 Pages.

* cited by examiner

SEMICONDUCTOR DEVICE

CROSS-REFERENCE TO RELATED APPLICATIONS

This application is based upon and claims the benefit of priority from Japanese Patent Application No. 2013-182595, filed on Sep. 3, 2013; the entire contents of which are incorporated herein by reference.

FIELD

Embodiments described herein relate generally to a semiconductor device.

BACKGROUND

In semiconductor devices, a voltage withstanding structure is provided as a structure for improving the breakdown voltage in the peripheral region outside the active region. An example of the voltage withstanding structure is a RESURF structure. The RESURF structure includes e.g. an electrode layer extending from the active region to the peripheral region, and a high concentration region in contact with the electrode layer. In semiconductor devices, reduction of contact resistance at the contact with the electrode layer in the voltage withstanding structure is important in achieving stable breakdown voltage characteristics.

DETAILED DESCRIPTION

Figure 1A:
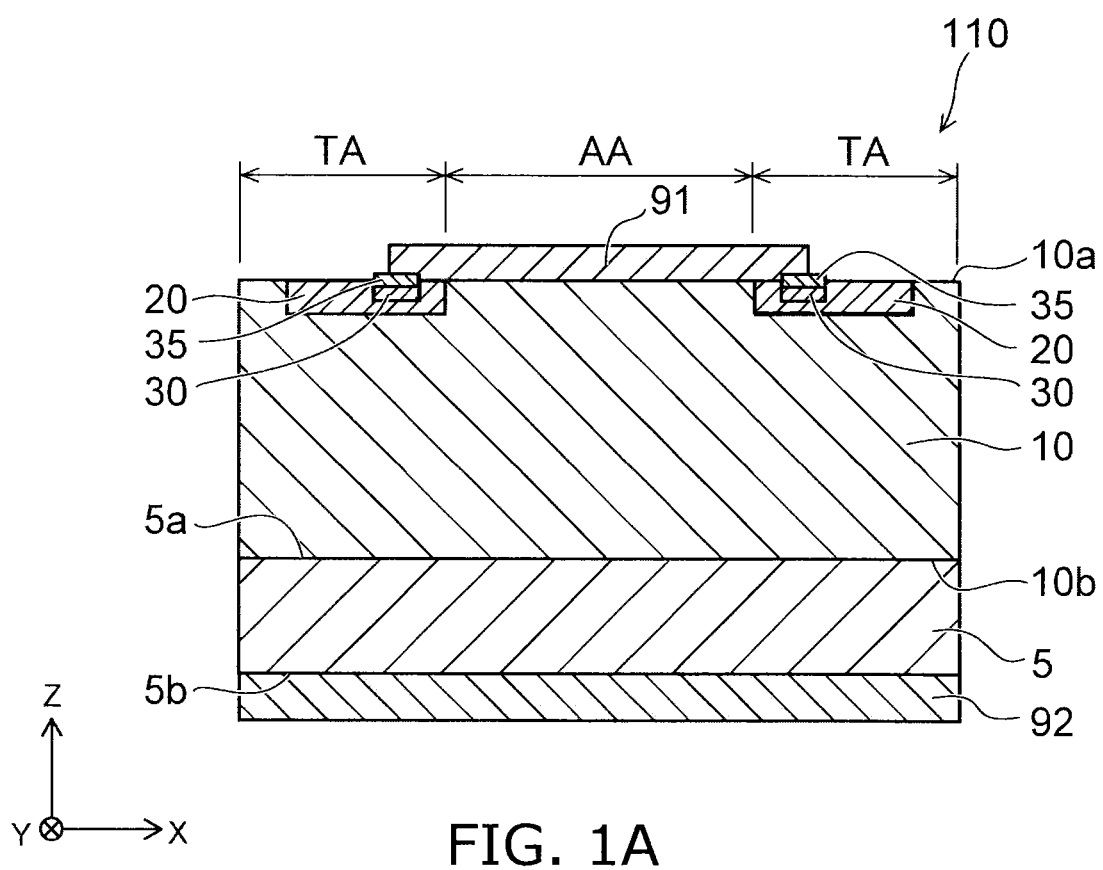
FIGS. 1A and 1B are schematic views illustrating the configuration of a semiconductor device according to a first embodiment.

According to one embodiment, a semiconductor device includes a first semiconductor region, a second semiconductor region, a third semiconductor region, and a first electrode. The first semiconductor region is of a first conductivity type. The second semiconductor region is provided on the first semiconductor region. The second semiconductor region is of a second conductivity type. The third semiconductor region is provided on the second semiconductor region. The third semiconductor region is of the second conductivity type. The third semiconductor region contains a first impurity of the first conductivity type and a second impurity of the second conductivity type, and satisfies $1<D2/D1<3$, where D1 is a first concentration of the first impurity in the third semiconductor region, and D2 is a second concentration of the second impurity in the third semiconductor region. The first electrode is provided on the first semiconductor region, the second semiconductor region, and the third semiconductor region. The first electrode is in contact with the second semiconductor region and the third semiconductor region.

According to one embodiment, a semiconductor device includes a first semiconductor region, a second semiconductor region, a third semiconductor region, an eighth semiconductor region, a first electrode, an insulating film, a second electrode, and a third electrode. The first semiconductor region is of a first conductivity type. The second semiconductor region is provided on the first semiconductor region. The second semiconductor region is of a second conductivity type. The third semiconductor region is provided on the second semiconductor region. The third semiconductor region is of the second conductivity type. The third semiconductor region contains a first impurity of the first conductivity type and a second impurity of the second conductivity type, and satisfies $1<D2/D1<3$, where D1 is a first concentration of the first impurity in the third semiconductor region, and D2 is a second concentration of the second impurity in the third semiconductor region. The eighth semiconductor region is provided on the second semiconductor region between the first semiconductor region and the third semiconductor region. The eighth semiconductor region is of the first conductivity type. The first electrode is provided on the first semiconductor region and the second semiconductor region. The first electrode is in contact with the second semiconductor region and the third semiconductor region. The insulating film is provided between the first semiconductor region and the first electrode. The second electrode is electrically connected to the first semiconductor region. The third electrode is in contact with the second semiconductor region, the third semiconductor region, and the eighth semiconductor region.

Various embodiments will be described hereinafter with reference to the accompanying drawings. In the following description, like members are labeled with like reference numerals, and the description of the members once described is omitted appropriately. In the following description, the notations of $n^+$, n, $n^-$ and $p^+$, p, $p^-$ represent relative magnitude of impurity concentration in each conductivity type. More specifically, $n^+$ represents relatively higher n-type impurity concentration than n, and $n^-$ represents relatively lower n-type impurity concentration than n. Furthermore, $p^+$ represents relatively higher p-type impurity concentration than p, and $p^-$ represents relatively lower p-type impurity concentration than p. The embodiments will be described assuming that the first conductivity type is n-type and the second conductivity type is p-type.

First Embodiment

Figure 1B:
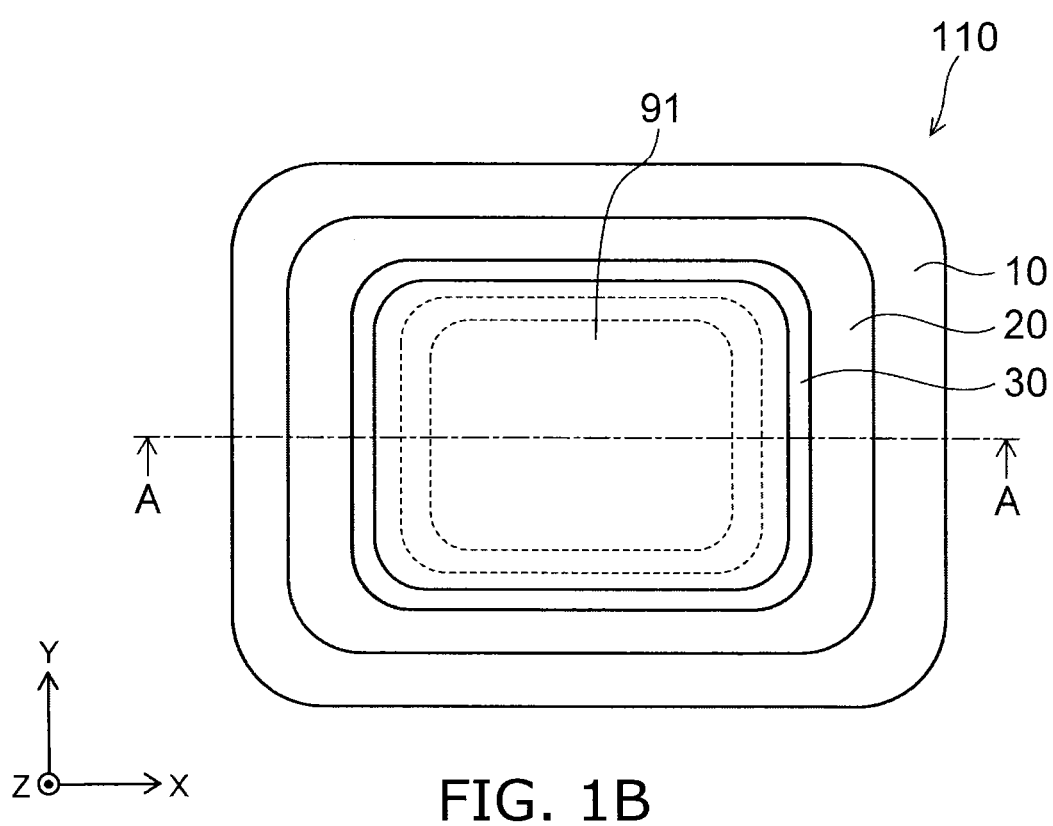

FIGS. 1A and 1B are schematic views illustrating the configuration of a semiconductor device according to a first embodiment.

FIG. 1A shows a schematic sectional view of the semiconductor device 110 according to the embodiment. FIG. 1B shows a schematic plan view of the semiconductor device 110 according to the embodiment. FIG. 1A shows a schematic sectional view taken along line A-A shown in FIG. 1B.

As shown in FIGS. 1A and 1B, the semiconductor device 110 includes a first semiconductor region 10, a second semiconductor region 20, a third semiconductor region 30, and a first electrode 91. The first semiconductor region 10, the second semiconductor region 20, and the third semiconductor region 30 each include e.g. silicon carbide (SiC). The semiconductor device 110 is e.g. a Schottky barrier diode (SBD) of SiC.

The first semiconductor region 10 includes a device region AA. The first semiconductor region 10 includes a termination region TA outside the device region AA. The conductivity type of the first semiconductor region 10 is a first conductivity type (n-type). The first semiconductor region 10 is a drift region of the SBD. The first semiconductor region 10 has e.g. a first surface 10a and a second surface 10b on the opposite side from the first surface 10a.

The second semiconductor region 20 is provided on the first semiconductor region 10. In the embodiment, the direction connecting the first semiconductor region 10 and the second semiconductor region 20 is referred to as Z-direction. One of the directions orthogonal to the Z-direction is referred to as X-direction. The direction orthogonal to the Z-direction and the X-direction is referred to as Y-direction. The direction from the first semiconductor region 10 toward the second semiconductor region 20 is referred to as "above" (upper side), and the opposite is referred to as "below" (lower side).

The second semiconductor region 20 is provided outside the device region AA. The conductivity type of the second semiconductor region 20 is a second conductivity type (p-type). The second semiconductor region 20 is provided along the first surface 10a of the first semiconductor region 10 so as to surround the outside of e.g. the device region AA. The second semiconductor region 20 is a RESURF layer of the RESURF structure.

The third semiconductor region 30 is provided on the second semiconductor region 20. The conductivity type of the third semiconductor region 30 is the second conductivity type ($p^+$-type). The third semiconductor region 30 is provided along the first surface 10a so as to surround the outside of e.g. the device region AA. The third semiconductor region 30 is a contact layer of the RESURF structure.

The first electrode 91 is provided on the first semiconductor region 10, the second semiconductor region 20, and the third semiconductor region 30. The first electrode 91 is e.g. an anode electrode of the SBD. The first electrode 91 is in contact with each of the first semiconductor region 10, the second semiconductor region 20, and the third semiconductor region 30. The first electrode 91 forms a Schottky junction with the first semiconductor region 10. The first electrode 91 is in ohmic contact with each of the second semiconductor region 20 and the third semiconductor region 30. In the embodiment, ohmic contact includes contact without Schottky junction.

The first electrode 91 is made of e.g. titanium (Ti). A contact electrode 35 in contact with the third semiconductor region 30 may be provided. For instance, the contact electrode 35 is included in the first electrode 91. The contact electrode 35 is made of e.g. nickel (Ni). The contact electrode 35 enables the first electrode 91 to be in good ohmic contact with the third semiconductor region 30.

The semiconductor device 110 includes a second electrode 92 and a semiconductor part 5. The semiconductor part 5 is provided between the second electrode 92 and the first semiconductor region 10. The semiconductor part 5 is e.g. a SiC substrate. In the semiconductor device 110, the semiconductor part 5 is of the first conductivity type ($n^+$-type).

The second electrode 92 is formed in contact with the back surface 5b of the semiconductor part 5. The second electrode 92 is e.g. a cathode electrode of the SBD. The second electrode 92 is made of e.g. Ni. The second electrode 92 is in ohmic contact with the semiconductor part 5.

In the semiconductor device 110 according to the embodiment, the third semiconductor region 30 contains impurity of the first conductivity type (n-type) and impurity of the second conductivity type (p-type). The amount (concentration) of impurity of the first conductivity type contained in the third semiconductor region 30 is denoted by D1, and the amount (concentration) of impurity of the second conductivity type contained therein is denoted by D2. Then, D2/D1 is more than 1 and less than 3. That is, $1<D2/D1<3$ is satisfied.

The relationship between the amount D1 of impurity of the first conductivity type and the amount D2 of impurity of the second conductivity type in the third semiconductor region 30 satisfies the foregoing. Thus, the contact resistance between the third semiconductor region 30 and the electrode (first electrode 91 or contact electrode 35) is reduced. This provides stable breakdown voltage characteristics of the semiconductor device 110.

Next, a specific example of the semiconductor device 110 is described.

The semiconductor part 5 includes e.g. hexagonal SiC (e.g., 4H—SiC). The semiconductor part 5 has a front surface 5a and a back surface 5b. The semiconductor part 5 is e.g. a SiC bulk substrate fabricated by sublimation technique.

The front surface 5a of the semiconductor part 5 is inclined by more than 0 degrees and 8 degrees or less with respect to the (0001) plane, which is a hexagonal SiC surface. For instance, the semiconductor part 5 is an off-substrate such as 2-degree off-substrate, 4-degree off-substrate, and 8-degree off-substrate.

The semiconductor part 5 is doped with n-type impurity (e.g., nitrogen (N)). The impurity concentration of the semiconductor part 5 is e.g. $1\times10^{18}$ cm$^{-3}$ or more and $1\times10^{20}$ cm$^{-3}$ or less. In the embodiment, the impurity concentration is approximately $5\times10^{18}$ cm$^{-3}$.

The first semiconductor region 10 includes n-type SiC. The first semiconductor region 10 is formed by e.g. epitaxial growth on the front surface 5a of the semiconductor part 5. The first semiconductor region 10 has a crystal structure similar to that of the semiconductor part 5.

The thickness of the first semiconductor region 10 is determined by the design of breakdown voltage and other characteristics of the semiconductor device 110. The thickness of the first semiconductor region 10 is e.g. approximately 200 micrometers (μm) or less.

The first semiconductor region 10 contains n-type impurity (e.g., N). The impurity concentration of the first semiconductor region 10 is lower than the impurity concentration of the semiconductor part 5. The impurity concentration of the first semiconductor region 10 is e.g. $5\times10^{14}$ cm$^{-3}$ or more and $1\times10^{17}$ cm$^{-3}$ or less.

The thickness of the second semiconductor region 20 is e.g. approximately 0.1 μm or more and 2 μm or less. The second semiconductor region 20 is placed along e.g. the periphery of the first electrode 91.

The second semiconductor region 20 includes p-type SiC. The second semiconductor region 20 contains p-type impurity (e.g., aluminum (Al) or boron (B)). The impurity concentration of the second semiconductor region 20 is e.g. $1\times10^{18}$ cm$^{-3}$ or more and $1\times10^{21}$ cm$^{-3}$ or less. The second semiconductor region 20 forms a p-n junction with the first semiconductor region 10.

The third semiconductor region 30 includes p-type SiC. The third semiconductor region 30 contains e.g. Al as p-type impurity, and e.g. N as n-type impurity. The concentration of p-type impurity contained in the third semiconductor region 30 is e.g. $1\times10^{18}$ cm$^{-3}$ or more. The concentration of n-type impurity is higher than ⅓ and lower than 1 times the concentration of p-type impurity.

Figure 2A:
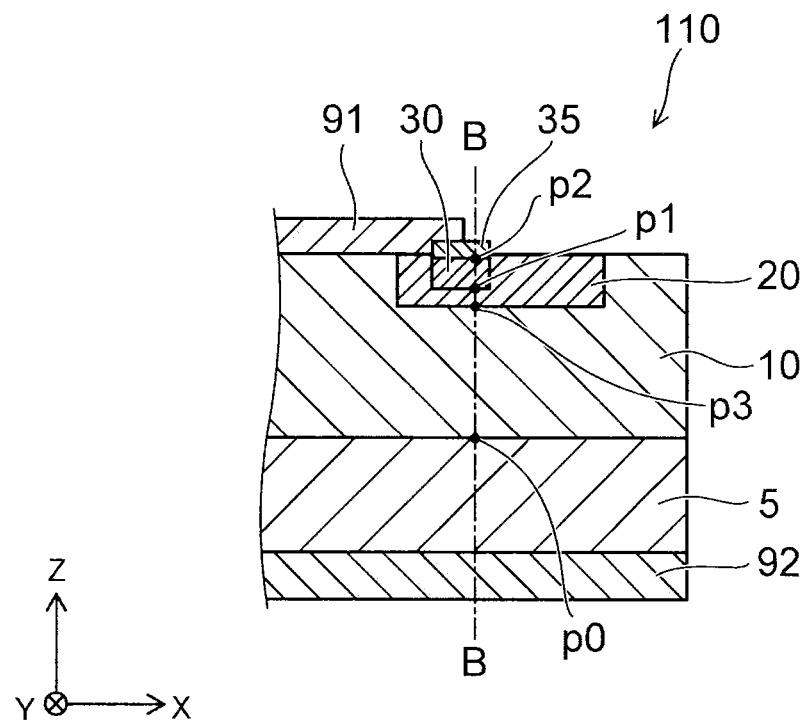
FIGS. 2A and 2B are schematic views illustrating the impurity concentration.
Figure 2B:
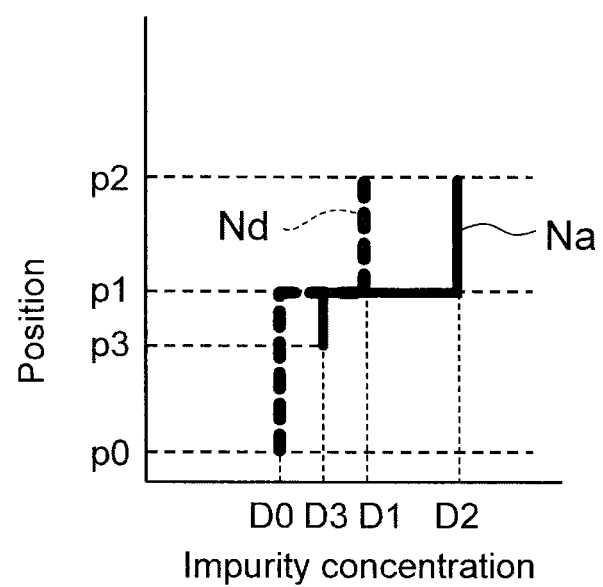

FIGS. 2A and 2B are schematic views illustrating the impurity concentration.

FIG. 2A shows a schematic sectional view of the semiconductor device 110. For convenience of description, FIG. 2A shows a cross section of half of the semiconductor device 110. FIG. 2B shows the impurity concentration of the semiconductor region. In FIG. 2B, the horizontal axis represents the amount of impurity, and the vertical axis represents the position of the semiconductor region. The vertical axis shown in FIG. 2B represents the position on line B-B shown in FIG. 2A.

As shown in FIGS. 2A and 2B, the range from position p0 to p3 represents the first semiconductor region 10. The first semiconductor region 10 contains n-type impurity Nd. The amount of n-type impurity Nd of the first semiconductor region 10 is D0. The position p3 to p1 represents the second semiconductor region 20. The amount of p-type impurity Na of the second semiconductor region 20 is D3.

The range from position p1 to p2 represents the third semiconductor region 30. The third semiconductor region 30 contains n-type impurity Nd and p-type impurity Na. The amount of n-type impurity Nd of the third semiconductor region 30 is D1, and the amount of p-type impurity Na is D2. The amount D1 of n-type impurity Nd of the third semiconductor region 30 is larger than the amount D0 of n-type impurity Nd of the first semiconductor region 10. The ratio of D2 to D1 is more than 1 and less than 3.

Next, the operation of the semiconductor device 110 is described.

A (forward) voltage is applied so that the first electrode 91 is made positive relative to the second electrode 92 of the semiconductor device 110. Then, electrons having crossed over the Schottky barrier from the first electrode 91 flow through the first semiconductor region 10 and the semiconductor part 5 to the second electrode 92.

On the other hand, a (reverse) voltage is applied so that the first electrode 91 is made negative relative to the second electrode 92 of the semiconductor device 110. Then, electrons cannot easily cross over the Schottky barrier between the first electrode 91 and the first semiconductor region 10. This suppresses the flow of the current.

In the semiconductor device 110, the contact resistance between the third semiconductor region 30 and the first electrode 91 is reduced. Thus, when a reverse voltage is applied, the overall potential of the second semiconductor region 20 being the RESURF region is easily made uniform. Accordingly, the electric field is gradually relaxed from the central portion (device region AA) to the peripheral portion (termination region TA) of the semiconductor device 110. That is, local electric field concentration is relaxed in the termination region TA. This provides stable breakdown voltage characteristics of the semiconductor device 110.

Figure 3:
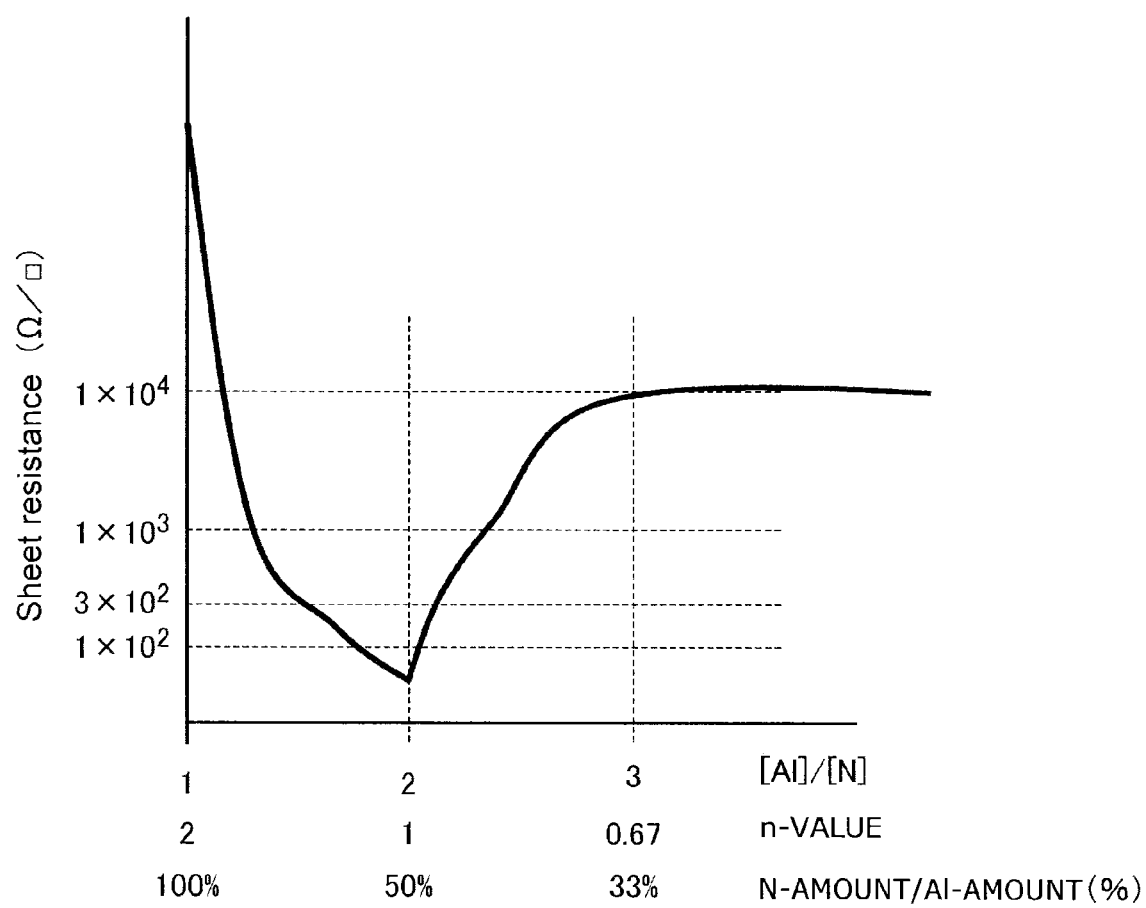
FIG. 3 illustrates the relationship between the amount of impurity and sheet resistance.

FIG. 3 illustrates the relationship between the amount of impurity and sheet resistance.

The horizontal axis shown in FIG. 3 represents the ratio between the amount of impurity of the first conductivity type (N) and the amount of impurity of the second conductivity type (Al) in the third semiconductor region 30 (hereinafter denoted by [Al]/[N]). The vertical axis shown in FIG. 3 represents the sheet resistance ($\Omega/\square$) at room temperature of the third semiconductor region 30. FIG. 3 shows a calculation result of simulating the sheet resistance in the case of changing [Al]/[N] in the third semiconductor region 30. In this calculation, the third semiconductor region 30 includes SiC, and the amount of Al is set to $2 \times 10^{20}$ cm$^{-3}$. For reference, the value of n, by which the amount of N is represented as $n \times 10^{20}$ cm$^{-3}$, and (amount of N)/(amount of Al) (%) (hereinafter referred to as N-amount/Al-amount), are represented on the horizontal axis of FIG. 3. Here, the sheet resistance refers to the electrical resistance of a square thin film from one side to the opposite side. The sheet resistance is measured by e.g. the method defined in the Japanese Industrial Standards (JIS C 2525).

As shown in FIG. 3, when [Al]/[N] exceeds 1 (N-amount/Al-amount is less than 100%), the sheet resistance of the third semiconductor region 30 decreases. The sheet resistance of the third semiconductor region 30 is minimized when [Al]/[N] is 2 (N-amount/Al-amount is 50%). The sheet resistance is $1 \times 10^{4} \Omega/\square$ or less when [Al]/[N] is approximately 1.05 or more and less than 3 (N-amount/Al-amount is more than 33% and approximately 95% or less). The sheet resistance is $1 \times 10^{3} \Omega/\square$ or less when [Al]/[N] is approximately 1.4 or more and 2.5 or less (N-amount/Al-amount is approximately 40% or more and 67% or less). The sheet resistance is $3 \times 10^{2} \Omega/\square$ or less when [Al]/[N] is approximately 1.67 or more and 2.22 or less (N-amount/Al-amount is 45% or more and 60% or less). The sheet resistance is $1 \times 10^{2} \Omega/\square$ or less when [Al]/[N] is approximately 1.79 or more and 2.13 or less (N-amount/Al-amount is 47% or more and 56% or less).

In the case where a semiconductor region is codoped with impurity of the first conductivity type and impurity of the second conductivity type, a shallow level is formed by interaction between dopants of opposite polarities. Thus, a shallow level is formed in semiconductor regions of any of the first conductivity type and the second conductivity type by the balance between the amount of impurity of the first conductivity type and the amount of impurity of the second conductivity type. Accordingly, the sheet resistance is reduced.

Here, of n-type and p-type, a shallow level is difficult to form particularly in p-type. Thus, in forming a p-type semiconductor region, p-type impurity and n-type impurity are codoped so that (amount of p-type impurity)/(amount of n-type impurity) is more than 1 and less than 3. Accordingly, the sheet resistance of the p-type semiconductor region is reduced by the formation of the shallow level.

For instance, in the case where Al and N codoped in SiC are each independent, a deep level is formed by Al. These Al and N may constitute a pair. Furthermore, two Al and one N may form a trimer. Then, the deep level of Al is converted to a shallow level by N. For instance, when (N substituting for C sites of SiC):(Al substituting for Si sites of SiC)=1:2, a very shallow p-type level is formed. The acceptor level of Al is approximately 160-200 meV. When SiC is codoped with Al and N at the aforementioned ratio, the acceptor level is reduced to approximately 60-80 meV.

Here, in the case where SiC is codoped with n-type and p-type impurities, the n-type impurity needs to be substituted for the C site. Thus, the donor is preferably N. The p-type impurity is preferably at least one selected from the group consisting of e.g. boron (B), Al, and gallium (Ga).

The concentration of impurity of the first conductivity type and the concentration of impurity of the second conductivity type in the third semiconductor region 30 are detected by e.g. SIMS (secondary ion mass spectrometry).

Figure 4A:
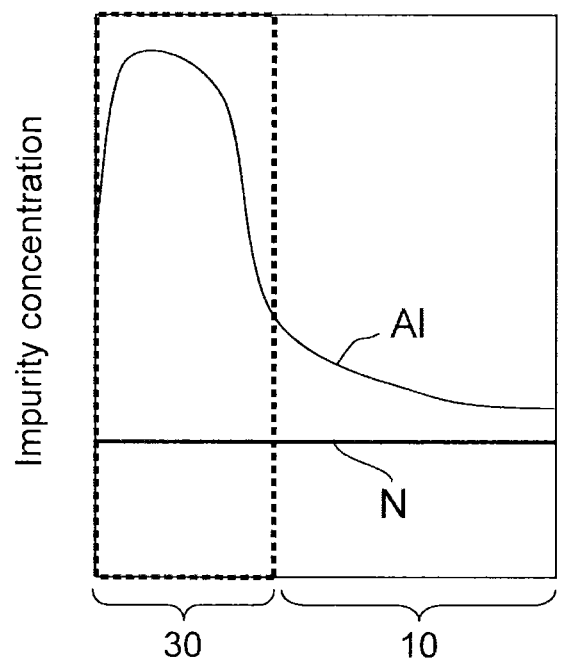
FIGS. 4A and 4B illustrate impurity concentration.
Figure 4B:
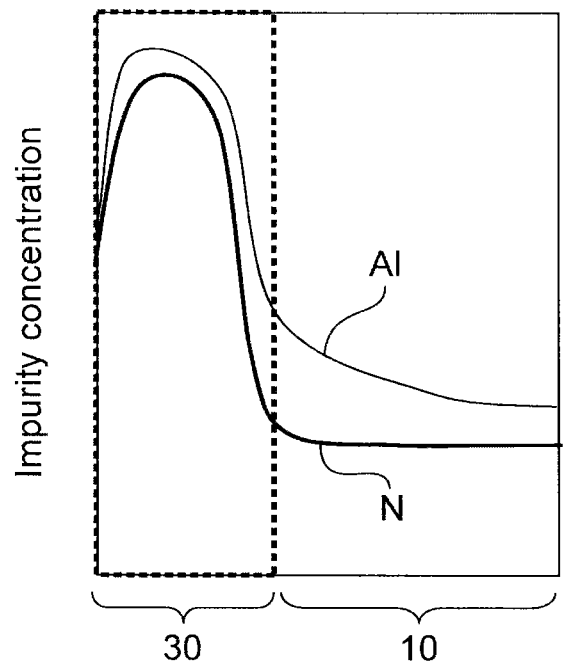

FIGS. 4A and 4B illustrate impurity concentration.

In FIGS. 4A and 4B, the horizontal axis represents depth, and the vertical axis represents impurity concentration. FIG. 4A illustrates a result of SIMS in the case where the amount of n-type impurity of the third semiconductor region is small. FIG. 4B illustrates a result of SIMS in the case where the amount of n-type impurity of the third semiconductor region is large.

The example shown in FIG. 4A indicates that n-type impurity (N) and p-type impurity (Al) are detected from the third semiconductor region 30. The concentration of the n-type impurity (N) is nearly equal to the concentration of the n-type impurity (N) of the first semiconductor region 10.

The example shown in FIG. 4B also indicates that n-type impurity (N) and p-type impurity (Al) are detected from the third semiconductor region 30. However, the concentration of the n-type impurity (N) is higher than the concentration of the n-type impurity (N) of the first semiconductor region 10. In the example shown in FIG. 4B, (concentration of p-type impurity (Al))/(concentration of n-type impurity (N)) in the third semiconductor region 30 is more than 1 and less than 3.

In the semiconductor device 110 as described above, the sheet resistance of the third semiconductor region 30 constituting the voltage withstanding structure is reduced. This provides stable breakdown voltage characteristics of the semiconductor device 110.

Second Embodiment

Next, a semiconductor device according to a second embodiment is described.

Figure 5A:
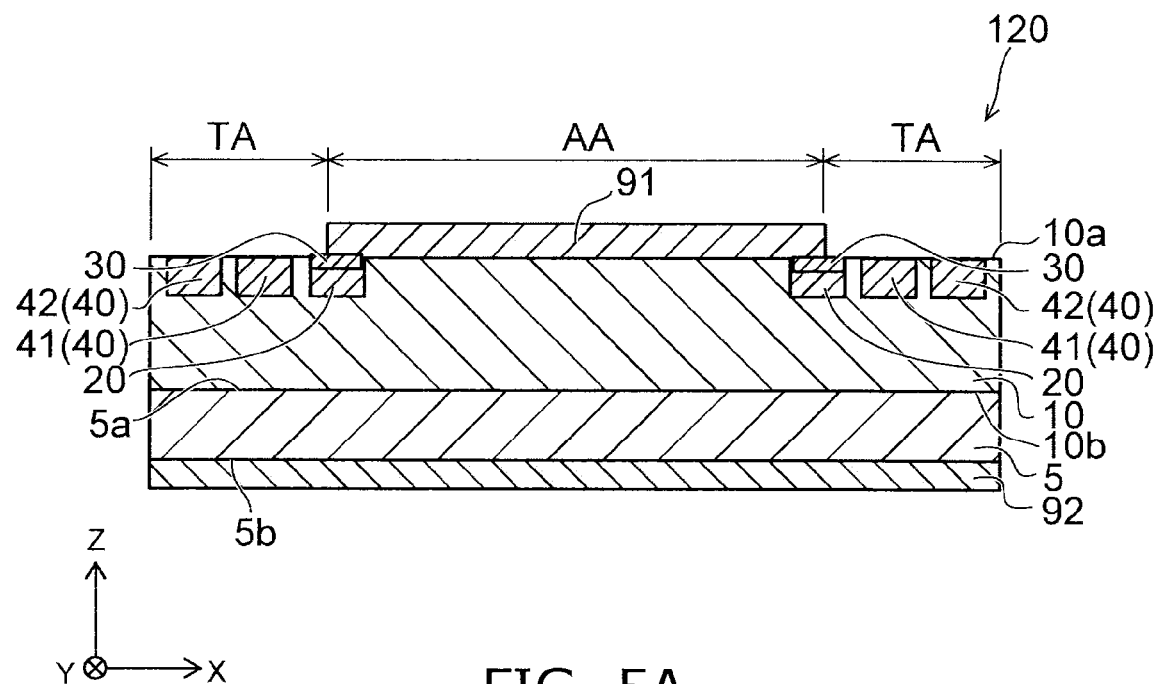
FIGS. 5A and 5B illustrate a semiconductor device according to the second embodiment.
Figure 5B:

FIGS. 5A and 5B illustrate a semiconductor device according to the second embodiment.

FIG. 5A shows a schematic sectional view of the semiconductor device 120 according to the second embodiment.

FIG. 5B shows an electric field distribution in the semiconductor device 120.

As shown in FIG. 5A, the semiconductor device 120 includes a fourth semiconductor region 40 provided outside the second semiconductor region 20 so as to surround the device region AA. The fourth semiconductor region 40 is a guard ring. The semiconductor device 120 is an SBD including a guard ring.

The fourth semiconductor region 40 is a region of the second conductivity type. The fourth semiconductor region 40 may be provided in a plurality. The semiconductor device 120 shown in FIG. 5A includes e.g. two fourth semiconductor regions 41, 42. The plurality of fourth semiconductor regions 41, 42 are spaced from each other. The fourth semiconductor region 41 is provided so as to surround the outside of the second semiconductor region 20. The fourth semiconductor region 42 is provided so as to surround the outside of the fourth semiconductor region 41.

The fourth semiconductor region 40 may be codoped with impurity of the first conductivity type and impurity of the second conductivity type. The amount of impurity of the second conductivity type is denoted by D4. The amount of impurity of the first conductivity type is denoted by D3. Then, $1<D4/D3<3$ is preferably satisfied. In the case where a plurality of fourth semiconductor regions 41, 42 are provided, $1<D4/D3<3$ may be satisfied for at least one of the plurality of fourth semiconductor regions 41, 42. Thus, the sheet resistance of the fourth semiconductor region 40, 41, 42 is reduced.

FIG. 5B shows an electric field distribution in the case where a reverse voltage is applied to the semiconductor device 120. In FIG. 5B, the horizontal axis represents position in the X-direction of the semiconductor device 120, and the vertical axis represents electric field intensity. In the manufacturing of the semiconductor device 120, misalignment of the first electrode 91 may occur. This is likely to cause imbalance of the electric field in the second semiconductor region 20 constituting the RESURF structure and the fourth semiconductor region 40 constituting the guard ring. The electric field distribution E2 is an electric field distribution of the semiconductor device not including the third semiconductor region 30. In the electric field distribution E2, imbalance of the electric field distribution is observed near the guard ring on one side.

In the semiconductor device 120, the sheet resistance of the third semiconductor region 30 and the fourth semiconductor region 40, 41, 42 is reduced. Then, imbalance of the electric field is less likely to occur even in the case where misalignment of the first electrode 91 occurs. The electric field distribution E1 is an electric field distribution of the semiconductor device 120 including the third semiconductor region 30. In the electric field distribution E1, no imbalance of the electric field distribution is observed. Thus, in the semiconductor device 120, the breakdown voltage in the termination region TA is improved.

Third Embodiment

Next, a semiconductor device according to a third embodiment is described.

Figure 6:
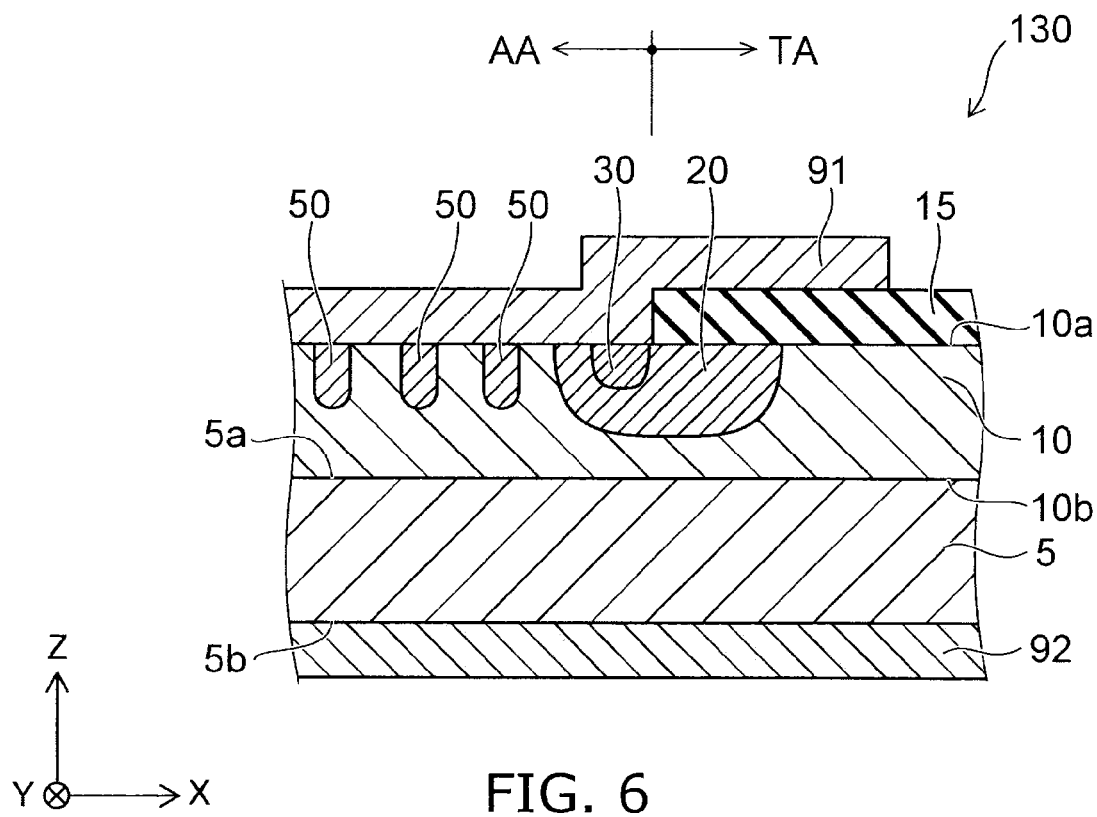
FIG. 6 is a schematic sectional view illustrating a semiconductor device according to the third embodiment.

FIG. 6 is a schematic sectional view illustrating a semiconductor device according to the third embodiment.

FIG. 6 shows a schematic sectional view of part of the semiconductor device 130 according to the third embodiment. The semiconductor device 130 includes a fifth semiconductor region 50 provided in the device region AA on the first semiconductor region 10. The fifth semiconductor region 50 is a region of the second conductivity type. The fifth semiconductor region 50 is spaced from the second semiconductor region 20. The fifth semiconductor region 50 is in contact with the first electrode 91. This semiconductor device 130 is e.g. an MPS (merged P-I-N Schottky rectifier).

In the semiconductor device 130, the third semiconductor region 30 contains the n-type impurity Nd and the p-type impurity Na. The amount of the n-type impurity of the third semiconductor region 30 is D1, and the amount of the p-type impurity Na is D2. The amount D1 of the n-type impurity Nd of the third semiconductor region 30 is larger than the amount D0 of the n-type impurity of the first semiconductor region 10. The ratio of D2 to D1 is more than 1 and less than 3. The sheet resistance can be reduced. The contact resistance of the voltage withstanding structure can be reduced.

The fifth semiconductor region 50 may be provided in a plurality. The plurality of fifth semiconductor regions 50 are spaced from each other. The fifth semiconductor regions 50 extend in e.g. the Y-direction. The fifth semiconductor region 50 may be provided like islands in the XY-plane.

Thus, when a reverse voltage is applied to the first electrode 91, a depletion layer extends from the fifth semiconductor region 50 to the termination region TA side of the second semiconductor region 20. Thus, the reverse leakage current is suppressed. This improves the breakdown voltage of the semiconductor device 130.

Figure 7:
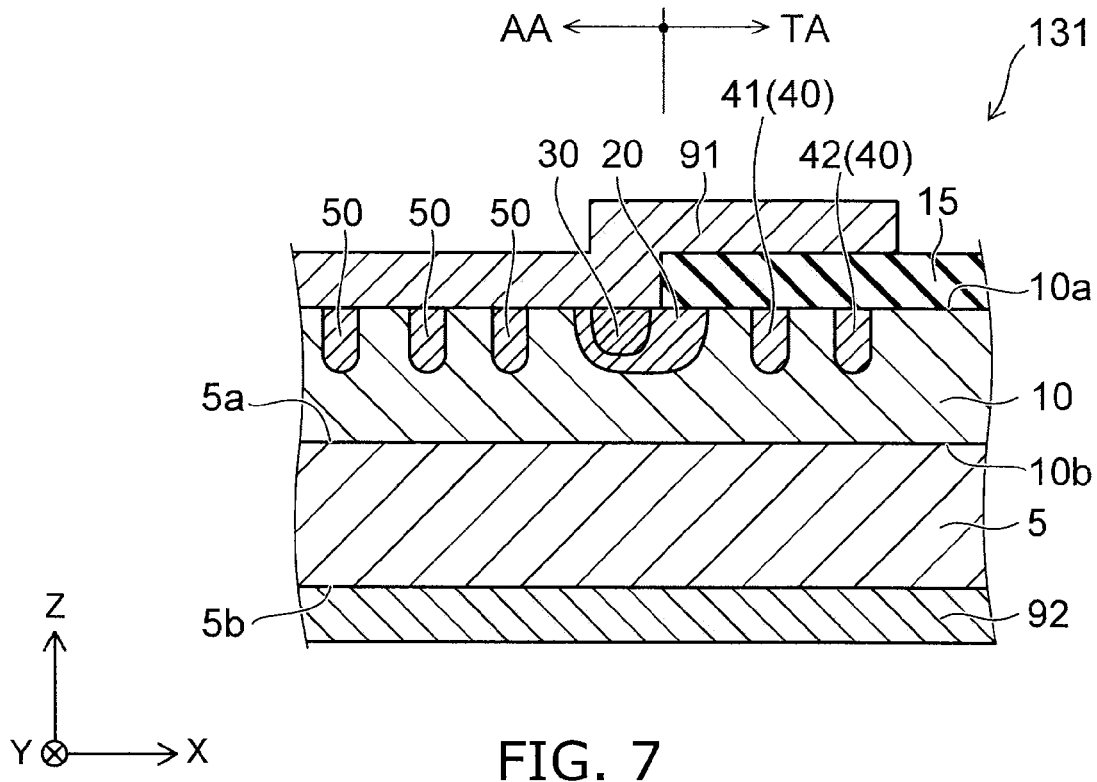
FIG. 7 is a schematic sectional view illustrating a semiconductor device according to an alternative example of the third embodiment.

FIG. 7 is a schematic sectional view illustrating a semiconductor device according to an alternative example of the third embodiment.

FIG. 7 shows a schematic sectional view of part of the semiconductor device 131. The semiconductor device 131 includes a fourth semiconductor region 40 in addition to the configuration of the semiconductor device 130. The fourth semiconductor region 40 may be provided in a plurality. In the example shown in FIG. 7, two fourth semiconductor regions 41, 42 are provided. An insulating film 15 is provided between the fourth semiconductor region 40, 41, 42 and the first electrode 91.

In the configuration of this semiconductor device 131, a plurality of guard rings are provided by the fourth semiconductor regions 40, 41, and 42 provided outside the second semiconductor region 20. This improves the breakdown voltage of the semiconductor device 131.

In the semiconductor device 131, the third semiconductor region 30 contains the n-type impurity Nd and the p-type impurity Na. The amount of the n-type impurity of the third semiconductor region 30 is D1, and the amount of the p-type impurity Na is D2. The amount D1 of the n-type impurity Nd of the third semiconductor region 30 is larger than the amount D0 of the n-type impurity of the first semiconductor region 10. The ratio of D2 to D1 is more than 1 and less than 3. The sheet resistance can be reduced. The contact resistance of the voltage withstanding structure can be reduced.

In the semiconductor device 131, the fourth semiconductor region 40 may be codoped with impurity of the first conductivity type and impurity of the second conductivity type. The amount of impurity of the second conductivity type is denoted by D4. The amount of impurity of the first conductivity type is denoted by D3. Then, 1<D4/D3<3 is preferably satisfied. In the case where a plurality of fourth semiconductor regions 41, 42 are provided, 1<D4/D3<3 may be satisfied for at least one of the plurality of fourth semiconductor regions 41, 42. Thus, the sheet resistance of the fourth semiconductor region 40, 41, 42 is reduced.

Fourth Embodiment

Next, a semiconductor device according to a fourth embodiment is described.

Figure 8:
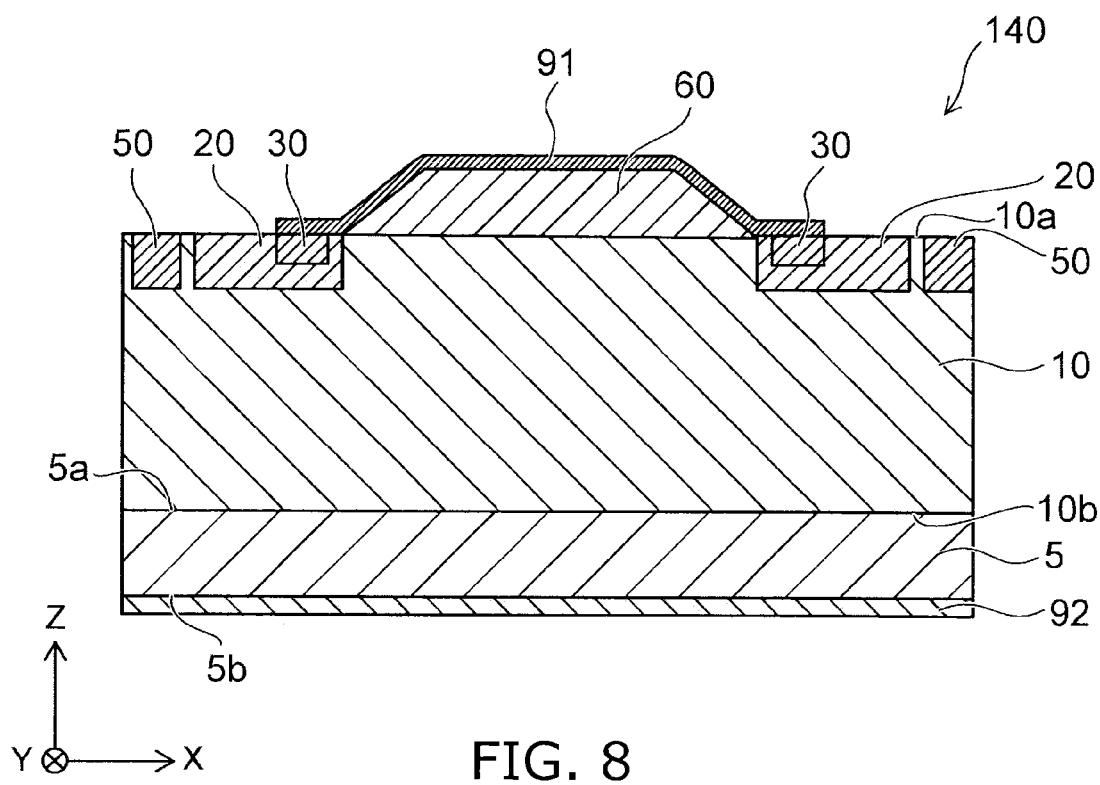
FIG. 8 is a schematic sectional view illustrating a semiconductor device according to the fourth embodiment.

FIG. 8 is a schematic sectional view illustrating a semiconductor device according to the fourth embodiment.

As shown in FIG. 8, the semiconductor device 140 according to the fourth embodiment includes a sixth semiconductor region 60 provided between the first semiconductor region 10 and the first electrode 91. The sixth semiconductor region 60 is a region of the second conductivity type. The semiconductor device 140 is e.g. a P-N diode.

In the semiconductor device 140, the third semiconductor region 30 contains the n-type impurity Nd and the p-type impurity Na. The amount of the n-type impurity of the third semiconductor region 30 is D1, and the amount of the p-type impurity Na is D2. The amount D1 of the n-type impurity Nd of the third semiconductor region 30 is larger than the amount D0 of the n-type impurity of the first semiconductor region 10. The ratio of D2 to D1 is more than 1 and less than 3. The sheet resistance can be reduced. The contact resistance of the voltage withstanding structure can be reduced.

The conductivity type of the sixth semiconductor region 60 is e.g. $p^+$-type. The sixth semiconductor region 60 includes e.g. SiC. The sixth semiconductor region 60 is formed by e.g. epitaxial growth on the first semiconductor region 10.

The thickness of the sixth semiconductor region 60 is e.g. approximately several μm. The sixth semiconductor region 60 is doped with p-type impurity. The impurity concentration is e.g. $1 \times 10^{16}$ cm$^{-3}$ or more and $5 \times 10^{19}$ cm$^{-3}$ or less.

In the semiconductor device 140, the sixth semiconductor region 60 and the first semiconductor region 10 constitute a p-n junction. The first electrode 91 is in ohmic contact with the sixth semiconductor region 60.

In the semiconductor device 140, the first semiconductor region 10 may be of $n^-$-type, and the semiconductor part 5 may be of $n^+$-type. In this case, the semiconductor device 140 is a P-i-N diode. In the P-i-N diode, the first semiconductor region 10 is a seventh semiconductor region.

Next, the operation of the semiconductor device 140 is described.

First, the operation is described in the case of applying a (forward) voltage so that the first electrode 91 is made positive relative to the second electrode 92 of the semiconductor device 140. In the case of applying a forward voltage, electrons and holes beyond the built-in potential flow between the sixth semiconductor region 60 and the first semiconductor region 10. Thus, a current flows in the semiconductor device 140 (forward operation).

Next, the operation is described in the case of applying a (reverse) voltage so that the first electrode 91 is made negative relative to the second electrode 92 of the semiconductor device 140. In the case of applying a reverse voltage, a depletion layer spreads between the sixth semiconductor region 60 and the first semiconductor region 10. Thus, little current flows in the semiconductor device 140 (reverse operation).

In the semiconductor device 140, the contact resistance between the third semiconductor region 30 and the first electrode 91 is low. Thus, the distribution of the potential is made uniform throughout the second semiconductor region 20. This improves the breakdown voltage in the reverse operation.

Fifth Embodiment

Next, a semiconductor device according to a fifth embodiment is described.

Figure 9:
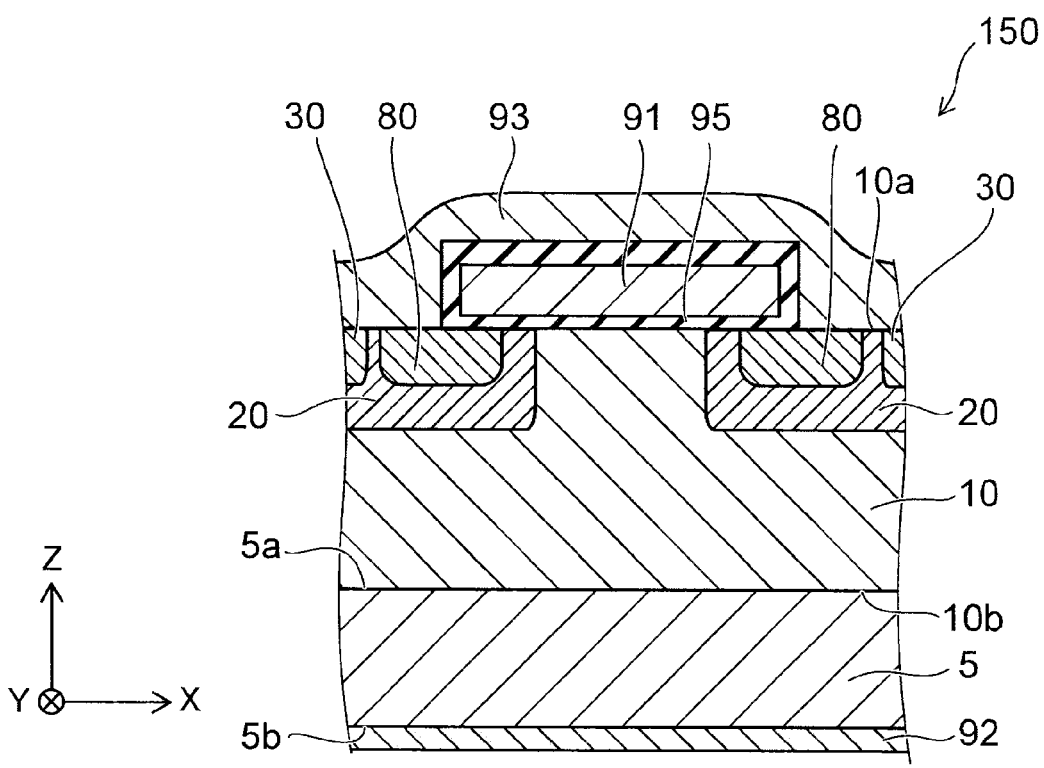
FIG. 9 is a schematic sectional view illustrating a semiconductor device according to the fifth embodiment.

FIG. 9 is a schematic sectional view illustrating a semiconductor device according to the fifth embodiment.

As shown in FIG. 9, the semiconductor device 150 according to the fifth embodiment includes an insulating film 95 provided between the first semiconductor region 10 and the first electrode 91. The semiconductor device 150 is e.g. a MOSFET (metal oxide semiconductor field effect transistor).

The semiconductor device 150 includes an eighth semiconductor region 80 provided on the second semiconductor region 20, and a third electrode 93 in contact with the eighth semiconductor region 80. The conductivity type of the eighth semiconductor region 80 is the first conductivity type. The third electrode 93 is in contact with the second semiconductor region 20, the third semiconductor region 30, and the eighth semiconductor region 80.

The eighth semiconductor region 80 is e.g. a source region of the MOSFET. The third electrode 93 is e.g. a source electrode of the MOSFET. The first electrode 91 is e.g. a gate electrode of the MOSFET. The second electrode 92 is e.g. a drain electrode of the MOSFET. In the semiconductor device 150, the second semiconductor region 20 between the eighth semiconductor region 80 and the first semiconductor region 10 is a channel formation region.

In the semiconductor device 150, the third semiconductor region 30 contains the n-type impurity Nd and the p-type impurity Na. The amount of the n-type impurity of the third semiconductor region 30 is D1, and the amount of the p-type impurity Na is D2. The amount D1 of the n-type impurity Nd of the third semiconductor region 30 is larger than the amount D0 of the n-type impurity of the first semiconductor region 10. The ratio of D2 to D1 is more than 1 and less than 3. The sheet resistance can be reduced. The contact resistance of the voltage withstanding structure can be reduced.

Next, the operation of the semiconductor device 150 is described.

The second electrode 92 is applied with a positive voltage relative to the third electrode 93. In this state, the first electrode 91 is applied with a voltage higher than or equal to the threshold. Then, an inversion layer (channel) is formed near the interface of the second semiconductor region 20 with the insulating film 95. This turns on the semiconductor device 150, and allows a current to flow from the second electrode 92 to the third electrode 93.

On the other hand, when the voltage applied to the first electrode 91 is lower than the threshold, the channel vanishes. This turns off the semiconductor device 150, and blocks the current flowing from the second electrode 92 to the third electrode 93.

In the semiconductor device 150, the contact resistance between the third semiconductor region 30 and the third electrode 93 is low. This improves the breakdown voltage in the reverse operation.

Sixth Embodiment

Next, a semiconductor device according to a sixth embodiment is described.

Figure 10:
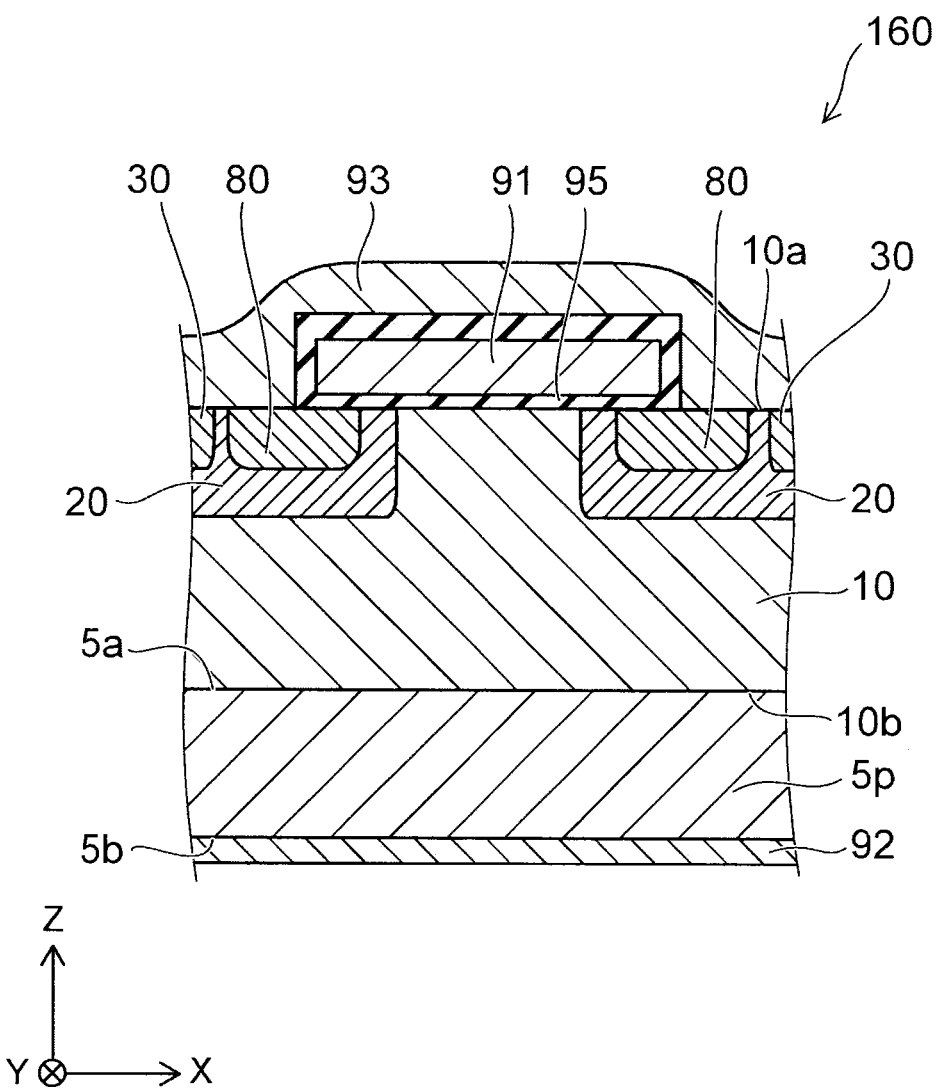
FIG. 10 is a schematic sectional view illustrating a semiconductor device according to the sixth embodiment.

FIG. 10 is a schematic sectional view illustrating a semiconductor device according to the sixth embodiment.

As shown in FIG. 10, the semiconductor device 160 according to the sixth embodiment includes a semiconductor part 5p provided between the first semiconductor region 10 and the second electrode 92. The configuration of the semiconductor device 160 other than the semiconductor part 5p is similar to that of the semiconductor device 150. The semiconductor device 160 is e.g. an IGBT (insulated gate bipolar transistor).

The conductivity type of the semiconductor part 5p is the second conductivity type. The eighth semiconductor region 80 is an emitter region of the IGBT. The second semiconductor region 20 is a base region of the IGBT. The third electrode 93 is e.g. an emitter electrode of the IGBT. The first electrode 91 is a gate electrode of the IGBT. The second electrode 92 is e.g. a collector electrode of the IGBT.

In the semiconductor device 160, the third semiconductor region 30 contains the n-type impurity Nd and the p-type impurity Na. The amount of the n-type impurity of the third semiconductor region 30 is D1, and the amount of the p-type impurity Na is D2. The amount D1 of the n-type impurity Nd of the third semiconductor region 30 is larger than the amount D0 of the n-type impurity of the first semiconductor region 10. The ratio of D2 to D1 is more than 1 and less than 3. The sheet resistance can be reduced. The contact resistance of the voltage withstanding structure can be reduced.

Next, the operation of the semiconductor device 160 is described.

The second electrode 92 is applied with a positive voltage relative to the third electrode 93. In this state, the first electrode 91 is applied with a voltage higher than or equal to the threshold. Then, an inversion layer (channel) is formed near the interface of the second semiconductor region 20 with the insulating film 95. Thus, electrons are injected from the eighth semiconductor region 80 through the channel into the second semiconductor region 20, and the semiconductor device 160 is turned on. At this time, furthermore, holes are injected from the second electrode 92 into the first semiconductor region 10. The holes injected into the first semiconductor region 10 flow through the second semiconductor region 20 to the third electrode 93. In the semiconductor device 160, in the on-state, holes are injected from the second electrode 92 into the first semiconductor region 10. This causes conductivity modulation and reduces the resistance of the first semiconductor region 10.

On the other hand, when the voltage applied to the first electrode 91 is lower than the threshold, the channel vanishes. This turns off the semiconductor device 160, and blocks the current flowing from the second electrode 92 to the third electrode 93.

In the semiconductor device 160, the contact resistance between the third semiconductor region 30 and the third electrode 93 is low. This improves the breakdown voltage in the off-state.

As described above, the semiconductor device according to the embodiments can reduce the contact resistance of the voltage withstanding structure and achieve stable breakdown voltage characteristics.

In the embodiment, the $p^+$-type third region 30 is codoped with the p-type impurity and the n-type impurity. In the case where the p-type impurity is taken as an element A, and the n-type impurity is taken as an element D, combination of the element A and the element D is at least one combination selected from combination of Al (aluminum), Ga (gallium), or In (indium) and N (nitrogen) (first combination) and combination of B (boron) and P (phosphorous) (second combination). For instance, a ratio of the concentration of the element D to the concentration of the element A forming the above combination is larger than 0.33 and smaller than 1.0. The concentration of the element A forming the above combination is e.g. $1\times10^{18}$ cm$^{-3}$ or more and $1\times10^{22}$ cm$^{-3}$ or less.

For instance, in the case of the first combination of Al (aluminum), Ga (gallium), or In (indium) and N (nitrogen), the element A may be one kind of element selected from Al (aluminum), Ga (gallium), or In (indium). The combination may be formed of two kinds of elements such as Al (element A1) and Ga (element A2), or three kinds of elements such as Al (element A1), Ga (element A2), In (element A3). In the case of multiple elements, the element forming the combination by joining two kinds or three kinds elements is referred to as the element A, a ratio of the concentration of the above element D to the concentration of the element A, and a condition for the concentration of the element A are only necessary to be fulfilled.

Both of the first combination and the second combination can coexist. The ration of the concentration of the element D to the concentration of the element A, and the condition of the concentration of the element A are fulfilled by the element constituting at least one of the first combination and the second combination. The first combination and the second combination satisfy the element ration and the element concentration, individually. The trimer is not formed between the impurity of the first combination and the second combination.

In the embodiment, nitrogen (N) and phosphorus (P) are favorable for the n-type impurity, for instance, however As (arsenic) or the like can be applied as well. Al (aluminum) is favorable for the p-type impurity, for instance, however B (born), In (indium) or the like can be applied as well.

Results of discussion by the applicants clarified that paring of Al and N can be caused to occur by codoping Al of the p-type impurity (p-type dopant) and N of the n-type impurity (n-type dopant). In this paring state, carriers are compensated, and a zero carrier state is obtained.

According to ab initio calculation made by the applicants, it has been made clear that Al occupies Si (silicon) site and N occupies C (carbon) site so that Al is adjacent to N in SiC, and thereby the system is stabilized.

Compared with a state in which Al and N are not bonded and loose, a state in which Al bond to N and the Al-N pair structure is formed is stabilized energetically by 2.9 eV. In the case where Al amount coincides with N amount, the state in which all of both form the pair structure is stable.

The ab initio calculation is a calculation based on a super soft pseudo-potential. The super soft pseudo-potential is one type of pseudo-potential. For instance, the calculation result of a lattice constant realizes an experimental value with an accuracy of 1% or less. The impurity (dopant) is introduced, the structure is relaxed, and the total energy of the stable state is calculated. The total energy of the system is compared before and after the change, and it is determined which structure is in the stable state. In the stable state, it is possible to indicate at which energy position the level of the impurity is located in the band gap.

In the case where N exits more than Al, that is, in the case of the n-type SiC, it has been made clear that the excess N occupies the C site near the Al—N pair structure, and forms the trimer of N—Al—N, and thereby the system is further stabilized. According to the ab initio calculation, forming the trimer more stabilizes the system by 0.3 eV than the case where the pair structure and N exist separately.

In the case where Al exits more than N, that is, in the case of the p-type SiC, it has been made clear that the excess Al occupies the Si site near the Al—N pair structure, and forms the trimer of Al—N—Al, and thereby the system is further stabilized. According to the ab initio calculation, forming the trimer more stabilizes the system by 0.4 eV than the case where the Al—N pair structure and Al exist separately.

Next, the combination of the dopant other than Al and N is explained to take the case of calculating for B (boron) and N (nitrogen) for example.

B occupies the Si site and N occupies the C site. According to the ab initio calculation, it has been found that the trimer structure of B—N—B or N—B—N is unable to be formed. That is, the pair structure of B—N is formed, however the system energy becomes high when B and N are near the pair structure. Therefore, the system is more stable energetically in the case where excess B and N exist independently at positions far from the pair structure.

According to the ab initio calculation, when the excess B forms the trimer, the energy of the system is higher by 0.5 eV then the case where the B—N pair and B exist independently. When the excess N formed the trimer, the energy of the system is higher by 0.3 eV than the case where the B—N pair and N exist independently. Thereby, in both cases, formation of the trimer causes the system to be unstable energetically.

In the case of B and N, formation of the trimer causes instability, and this could be understood from a size of a covalent bond diameter. The covalent bond diameter of B is smaller than the covalent bond diameter of Si, and the covalent bond diameter of N is smaller than the covalent bond diameter of C. Therefore, when B occupies the Si site, and N occupies the c site, strain is storage and the trimer is not formed.

It has become clear that the trimer is unable to be formed other than the case the combination of "elements (Al, Ga, In) having the larger covalent bond diameter than Si" with "element (N) having the smaller covalent bond diameter than C", or the inverse combination of "element (B) having the larger covalent bond diameter than C" with "element (P) having the smaller covalent bond diameter than Si" as the combination of the p-type impurity with the n-type impurity serving as dopants.

Because the covalent bond diameters of B, P are between the covalent bond diameter of Si and the covalent bond diameter of C, B and P can occupy either site of Si or C. However, other impurities (Al, Ga, In, N, As) are basically one-sided to one site. It may be considered that Al, Ga, In, As occupy the Si site and N occupy the C site.

Furthermore, the case where both impurities occupy the Si site together or the C site together is not needed to be considered. This is because of strain not easily relaxed when the p-type impurity and the n-type impurity do not come nearest. Consequently, when the p-type impurity is taken as the element A, and the n-type impurity is taken as the element D, it is difficult to form the trimer in the case other than four combinations of (Al and N), (Ga and N), (In and N), (B and P).

This pair structure or the trimer is unable to be formed without interaction between atoms. The interaction is not observed for the impurity level (dopant level) in a 4H—SiC structure by the ab initio calculation in the case of approximate 10 unit cells in a c-axis direction, and the impurity level is in a flat state. That is, dispersion is sufficiently suppressed, and is approximately 10 meV to 100 meV.

In other words, it is considered that the interaction is not almost operated in the case of a distance between impurities being 10 nm or more. Consequently, it is desired that the impurity concentration, is for example, $1 \times 10^{18}$ cm$^{-3}$ or more for operation of the interaction between the impurities.

This value is a lower limit of the impurity concentration desired for forming a local impurity distribution by ion-implantation or the like in the case where SiC material is already formed.

In the embodiment, the ratio of the n-type impurity concentration to the p-type impurity concentration is set to be within a specified range. The effect due to codoping is developed in the semiconductor SiC. For instance, the impurities are introduced from the first so that the ratio of respective n-type and p-type impurities introduced by the ion-implantation is a ratio within the specified range. The interaction operable range is small to be less than 10 nm, however the formation of the trimer is possible by mutual attractive force if within the range. Furthermore, the attractive force is operated, it is considered that an activation anneal temperature of impurities can be reduced from a temperature of 1700° C. to 1900° C. with no codoping to a temperature of 1500° C. to 1800° C.

This impurity concentration desired for the formation of the trimer is capable of reducing in crystal growth from vapor phase based on CVD (Chemical Vapor Deposition) or the like. Because source material can be flown on a surface and the interaction between the impurities is easy to occur also at a low concentration.

In the vapor phase growth, the impurity concentration region formable of the trimer is enlarged to $1 \times 10^{15}$ cm$^{-3}$ or more and $1 \times 10^{22}$ cm$^{-3}$ or less in comparison with the ion-implantation. In the vapor phase growth, it is either possible to set the impurity concentration of SiC to be thin, for instance, to approximately $1 \times 10^{16}$ cm$^{-3}$, or to set thick, for instance, to approximately $1 \times 10^{21}$ cm$^{-3}$. Particularly, a region with the thin concentration is difficult to be formed by ion-implantation. Therefore, particularly in the region with the thin concentration, formation of the impurity region by the vapor phase growth is effective. Furthermore, in the vapor phase growth, it is also possible to form a codoped extremely thin film of approximate 5 nm, for instance.

The vapor phase growth has an advantage that crystal defect is difficult to occur in the region with the thick impurity concentration. In the ion-implantation, increase of introduced impurity amount causes increase of the crystal defect, and recovery by heat treatment or the like becomes difficult. In the vapor phase growth, the trimer is formed during the growth, and the defect due to the impurity introduction is difficult to occur. From this viewpoint, the formation of the impurity region by the vapor phase growth is effective, for instance, in the region of the impurity concentration of $1 \times 10^{19}$ cm$^{-3}$ or more, furthermore $1 \times 10^{20}$ cm$^{-3}$ or more.

In the ion-implantation, it is possible to form the locally codoped impurity region, and is possible to form the codoped impurity region with a low cost. The vapor phase growth and the ion-implantation are used as necessary.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the modifications thereof described above are within the scope of the invention to the extent that the purport of the invention is included.

For instance, in the above description of the embodiments and variations, the first conductivity type is n-type, and the second conductivity type is p-type. However, the invention is also practicable when the first conductivity type is p-type and the second conductivity type is n-type. Furthermore, in the above description of the embodiments, SiC is used as an example of the semiconductor material. However, the semiconductor material is not limited to SiC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor region of a first conductivity type;
a second semiconductor region of a second conductivity type provided on the first semiconductor region;
a third semiconductor region of the second conductivity type provided on the second semiconductor region, containing a first impurity of the first conductivity type and a second impurity of the second conductivity type; and
a first electrode provided on the first semiconductor region, the second semiconductor region, and the third semiconductor region, the first electrode being in contact with the second semiconductor region and the third semiconductor region,
wherein
the third semiconductor region includes a first part, a second part, and a third part, the second part is provided between the first part and the first semiconductor region, the third part is provided between the second part and the first semiconductor region,
a concentration of the first impurity in the second part is higher than a concentration of the first impurity in the first part and higher than a concentration of the first impurity in the third part,
a concentration of the second impurity in the second part is higher than a concentration of the second impurity in the first part and higher than a concentration of the second impurity in the third part, and
a ratio of the concentration of the second impurity in the second part to the concentration of the first impurity in the second part is higher than 1 and lower than 3.

2. The device according to claim 1, wherein the first semiconductor region, the second semiconductor region, and the third semiconductor region each include SiC.

3. The device according to claim 1, wherein
the first conductivity type is n-type, and
the second conductivity type is p-type.

4. The device according to claim 1, wherein
the first semiconductor region includes a device region, and
the second semiconductor region is provided along a first surface of the first semiconductor region so as to surround outside of the device region.

5. The device according to claim 1, wherein the sec-end concentration of the second impurity in the second part is $1 \times 10^{18}$ cm$^{-3}$ or more.

6. The device according to claim 1, wherein a sheet resistance of the third semiconductor region is $1 \times 10^{4} \Omega/\square$ or less.

7. The device according to claim 1, further comprising:
a fourth semiconductor region of the second conductivity type provided so as to surround outside of the second semiconductor region.

8. The device according to claim 7, wherein $1<D4/D3<3$ is satisfied, where D4 is a concentration of an impurity of the second conductivity type contained in the fourth semiconductor region, and D3 is a concentration of an impurity of the first conductivity type contained in the fourth semiconductor region.

9. The device according to claim 7, wherein
the fourth semiconductor region is provided in a plurality, and
the plurality of fourth semiconductor regions are spaced from each other.

10. The device according to claim 9, wherein $1<D4/D3<3$ is satisfied, where D4 is a concentration of the impurity of the second conductivity type contained in at least one of the fourth semiconductor regions, and D3 is a concentration of the impurity of the first conductivity type contained in the at least one of the fourth semiconductor regions.

11. The device according to claim 1, further comprising:
a second electrode; and
a semiconductor part provided between the second electrode and the first semiconductor region and being in ohmic contact with the second electrode.

12. The device according to claim 11, wherein the semiconductor part is of the first conductivity type.

13. The device according to claim 1, wherein the first electrode forms a Schottky junction with the first semiconductor region.

14. The device according to claim 1, further comprising:
a fifth semiconductor region of the second conductivity type provided on the first semiconductor region, spaced from the second semiconductor region, and being in contact with the first electrode.

15. The device according to claim 14, wherein
the fifth semiconductor region is provided in a plurality, and
the plurality of fifth semiconductor regions are spaced from each other.

16. The device according to claim 1, further comprising:
a sixth semiconductor region of the second conductivity type provided between the first semiconductor region and the first electrode.

17. The device according to claim 16, further comprising:
a semiconductor part of the first conductivity type,
the first semiconductor region being provided between the sixth semiconductor region and the semiconductor part, and
an impurity concentration of the first semiconductor region being lower than an impurity concentration of the semiconductor part.

18. The device according to claim 1, wherein a ratio of the concentration of the second impurity in the first part to the concentration of the first impurity in the first part is higher than 1 and lower than 3.

19. The device according to claim 1, wherein a ratio of the concentration of the second impurity in the third part to the concentration of the first impurity in the third part is higher than 1 and lower than 3.

* * * * *